(12) United States Patent
Lee

(10) Patent No.: US 7,531,901 B2
(45) Date of Patent: May 12, 2009

(54) METAL INTERCONNECTION OF SEMICONDUCTOR DEVICE AND METHOD FOR FORMING THE SAME

(75) Inventor: Ki Min Lee, Chungbuk (KR)

(73) Assignee: Dongbu HiTek Co., Ltd., Seoul (KR)

( * ) Notice: Subject to any disclaimer, the term of this patent is extended or adjusted under 35 U.S.C. 154(b) by 122 days.

(21) Appl. No.: 11/615,787

(22) Filed: Dec. 22, 2006

(65) Prior Publication Data

US 2007/0155171 A1    Jul. 5, 2007

(30) Foreign Application Priority Data

Dec. 29, 2005  (KR) .................. 10-2005-0134354

(51) Int. Cl.
    *H01L 23/48*    (2006.01)
    *H01L 21/4763*  (2006.01)
(52) U.S. Cl. .................. 257/751; 257/758; 438/643; 438/653

(58) Field of Classification Search .............. 438/622, 438/625, 627, 634, 637, 643, 653, 687; 257/750, 257/751, 758, 759, 762, 774
See application file for complete search history.

(56) References Cited

U.S. PATENT DOCUMENTS

| | | | |
|---|---|---|---|
| 6,879,042 B2 * | 4/2005 | Ohto et al. .................. | 257/751 |
| 2003/0209738 A1 * | 11/2003 | Ohto et al. .................. | 257/257 |
| 2007/0099010 A1 * | 5/2007 | Hohage et al. .............. | 428/457 |

FOREIGN PATENT DOCUMENTS

KR    1020040084668 A    10/2004

* cited by examiner

*Primary Examiner*—Kevin M Picardat
(74) *Attorney, Agent, or Firm*—Sherr & Vaughn, PLLC

(57) ABSTRACT

A metal interconnection of a semiconductor device and a method for forming the same include a diffusion barrier having favorable EM (electro migration) and SM (stress induced migration) properties, thereby preventing voids or other defects in copper interconnections. The diffusion barrier is made of two layers to better match coefficients of thermal expansion at the boundaries between layers, while also providing better adhesion between layers.

18 Claims, 3 Drawing Sheets

METAL INTERCONNECTION OF SEMICONDUCTOR DEVICE AND METHOD FOR FORMING THE SAME

The present application claims priority under 35 U.S.C. 119 and 35 U.S.C. 365 to Korean Patent Application No. 10-2005-0134354 (filed on Dec. 29, 2005), which is hereby incorporated by reference in its entirety.

BACKGROUND

As semiconductor devices have trended towards higher speeds and larger scale integration, metal interconnections formed in semiconductor devices have sub-micron feature sizes and a multi-layer structure. As the width of metal interconnections is narrowed, an increased signal delay is generated due to the increased resistance or capacitance of the metal interconnections. Thus, copper interconnections, which have a relatively low resistance, have been used to reduce such signal delay.

Since copper is not as easily etched as compared with aluminum, for example, a trench is formed to properly shape a copper interconnection. A copper layer is deposited to fill the trench, and then a damascene process including the chemical and mechanical polishing (CMP) is performed, thereby forming the copper interconnection.

However, a diffusion barrier must be formed between the copper interconnection and an insulating layer due to the propensity of copper to diffuse into other layers. A diffusion barrier should adhere well to both the copper layer and an interlayer dielectric layer. It should also possess excellent EM (electro migration) and SM (stress induced migration) properties.

However, most diffusion barriers have a shortcoming. The diffusion barriers with good EM properties have poor SM properties, and diffusion barriers having good SM properties have poor EM properties.

In particular, the SM property may be deteriorated by a difference in the thermal expansion coefficients between the diffusion barrier and the copper or between the diffusion barrier and the insulating layer, and a void may be generated.

Such a void may interrupt the signal transmission in the copper interconnection, thereby reducing reliability of the device.

SUMMARY

Embodiments relate to a metal interconnection of a semiconductor device and a method for forming the same, in which a diffusion barrier having favorable SM properties and EM properties is formed, thereby preventing a copper interconnection from being disconnected.

To accomplish the above object of the embodiments, there is provided a metal interconnection in a semiconductor device comprising a semiconductor substrate including an electric conductor. First and second diffusion barriers are formed over the semiconductor substrate. An interlayer dielectric layer may be formed over the second diffusion barrier having a trench exposing the electric conductor. A metal interconnection is formed to fill the trench. The difference in thermal expansion coefficients between the second diffusion barrier and the interlayer dielectric layer is smaller than a difference in thermal expansion coefficients between the first diffusion barrier and the interlayer dielectric layer.

According to embodiments, a method for forming a metal interconnection of a semiconductor device includes stacking a first diffusion barrier, a second diffusion barrier and an interlayer dielectric layer over a semiconductor substrate having an electric conductor formed therein. A trench is formed by a selective etching process to expose the second diffusion barrier. A metal interconnection is formed to fill the trench.

The difference in thermal expansion coefficients between the second diffusion barrier and the interlayer dielectric layer is smaller than the difference in thermal expansion coefficients between the first diffusion barrier and the interlayer dielectric layer.

The first diffusion barrier may include SiN, SiC or SiCN.

The second diffusion barrier may include SiC or SiON.

The first diffusion barrier may be two layers; the first layer may be SiN and the second layer may be SiCN. The second diffusion barrier may be made of SiC.

The electric conductor and the metal interconnection may be made of copper.

The above and other objects, features and advantages of the embodiments will be apparent from the following detailed description of the embodiments in conjunction with the accompanying drawings.

BRIEF DESCRIPTION OF THE DRAWINGS

Example

Example

Example

Example

DETAILED DESCRIPTION

Figure 1:
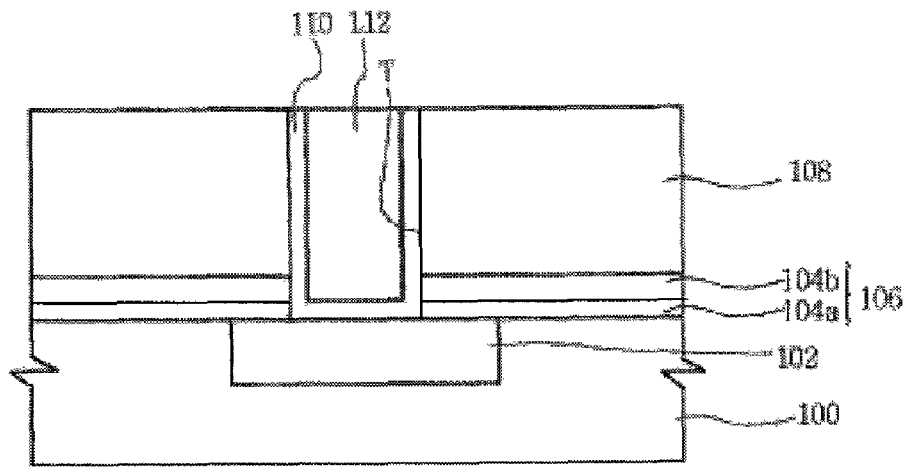
FIG. 1 is a cross-sectional view showing a metal interconnection of a semiconductor device according to embodiments.

As shown in FIG. 1, a diffusion barrier 106 and an interlayer dielectric layer 108 are sequentially deposited over a substrate 100.

The substrate 100 includes individual elements (not shown) or a lower conductor 102. The lower conductor 102 may be an interconnection formed of a copper or the like, having a relatively low resistance.

The diffusion barrier 106 includes a first diffusion barrier 104a and a second diffusion barrier 104b, which differ from each other in their characteristics. The first diffusion barrier 104a may be formed of any one of SiN, SiC or SiCN, and the second diffusion barrier 104b may be formed of SiC or SiON.

The first diffusion barrier 104a may be made of a material having a high adhesion with the lower conductor 10 since it directly abuts against the lower conductor 102. The second diffusion barrier 104b may be made of a material having a low thermal expansion coefficient with respect to the lower conductor 102 although it has a lower adhesion as compared to the first diffusion barrier 104a.

In this regard, the diffusion barrier 106 may be formed of SiN/SiC, SiCN/SiC, or SiC/SiON. The first diffusion barrier 104a may also be formed in a double layer structure, with the second diffusion barrier 104b in a single layer structure, thereby forming a diffusion barrier with a triple layer structure. For example, the diffusion barrier 106 may be formed of SiN/SiCN/SiC. The SiCN has an intermediate physical property between SiC and SiN, and may function as a buffer between them.

The interlayer dielectric layer 108 may be an organic insulator, an inorganic insulator, or the like, such as FSG (fluorine silicate glass), USG (un-doped silicate glass), or SiH4, TEOS (tetra ethyl ortho silicate) deposited in a single layer or multiple layers. The interlayer dielectric layer 108 may be formed using materials having low dielectric constant of ≦3.0 such as BD (black diamond), Silica xerogels, mesoporous silica, polyimide nanofoams, Teflon-AF, Teflon microemulsion, or the like.

The interlayer dielectric layer 108 and the diffusion barrier 106 include a trench (T) formed therein, exposing the lower conductor 102 or individual elements.

The trench (T) includes a barrier metal 110 and a metal interconnection 112, to which the lower conductor 102 or individual elements are electrically connected. The thin barrier metal 110 is formed along the inner surface of the trench (T), and the metal interconnection 110 fills the trench defined by the inner surface of barrier metal 110.

The barrier metal 110 functions to prevent metal interconnection 112 from diffusing into other layers such as the interlayer dielectric layer 108. The barrier metal 110 also improves the adhesion between the metal interconnection 112 and the interlayer dielectric layer 108.

The barrier metal may be made of a material such as TaN, Ta, TiN, TaSiN, TiSiN, etc., and may be formed in a single layer or multiple layers. The metal interconnection 112 is made of a conductive material, for example copper, having a relatively low resistance.

Figure 2:
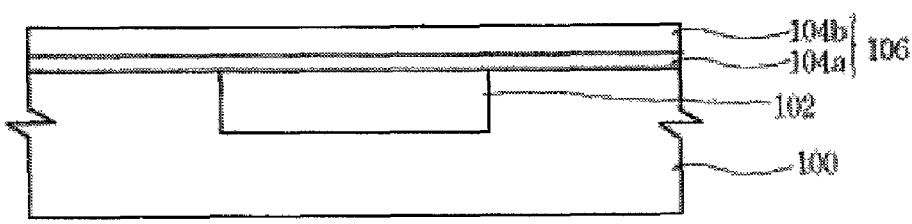
FIGS. 2 to 3 are cross-sectional views showing a method for forming a metal interconnection of a semiconductor device according to embodiments.
Figure 3:
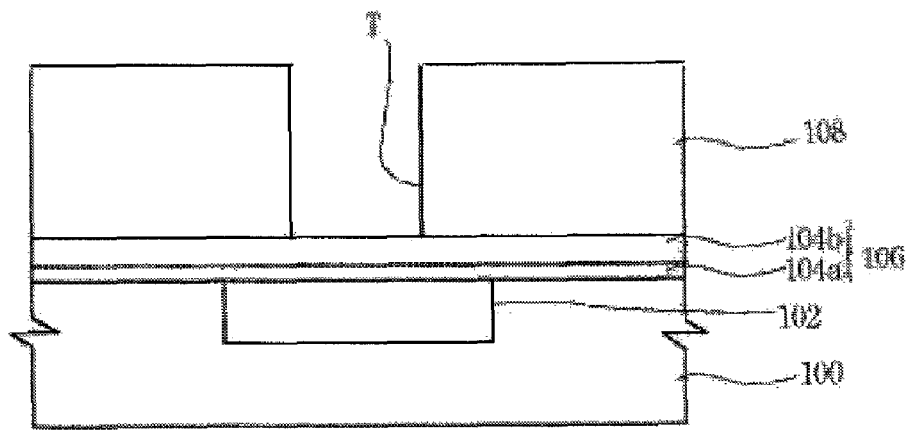

Example FIGS. 2 to 3 are cross-sectional views showing a method for forming a metal interconnection of a semiconductor device according to embodiments.

As shown in FIG. 2, a diffusion barrier 106 including the first and second diffusion barriers 104a, 104b is formed over substrate 100.

The first diffusion barrier 104a may be formed of SiN, SiC, SiCN or the like, and the second diffusion barrier 104b may be formed of SiC or SiON.

The SiN may be formed by the reaction of SiH4 gas and NH3 gas. The SiON may be formed by the reaction of SiH4 gas, CO gas and O2 gas, and the SiCN may be formed by the reaction of SiH4 gas, NH3 gas, and CH4 gas.

If the first diffusion barrier 104a is formed by SiN, it may have a thickness about 100~300 Å. If the first diffusion barrier 104a is formed by SiC, it may have a thickness about 300~700 Å. The second diffusion barrier 104b may be formed with a thickness of about 500~1,000 Å.

As shown in FIG. 3, the interlayer dielectric layer 108 is formed by depositing an insulating material over the diffusion barrier 106. The interlayer dielectric layer 108 may be etched by a selective etching process, forming trench (T) exposing the diffusion barrier 106.

As shown in FIG. 1, a first metal layer is formed by depositing a metal over the substrate 100 including the trench (T). Then, a second metal layer is formed by depositing copper, filling the trench.

The chemical and mechanical polishing (CMP) is used to flatten or planarize the substrate 100, thereby forming the barrier metal 100 and the metal interconnection 112 into a shape similar to that shown in FIG. 1.

Figure 4:
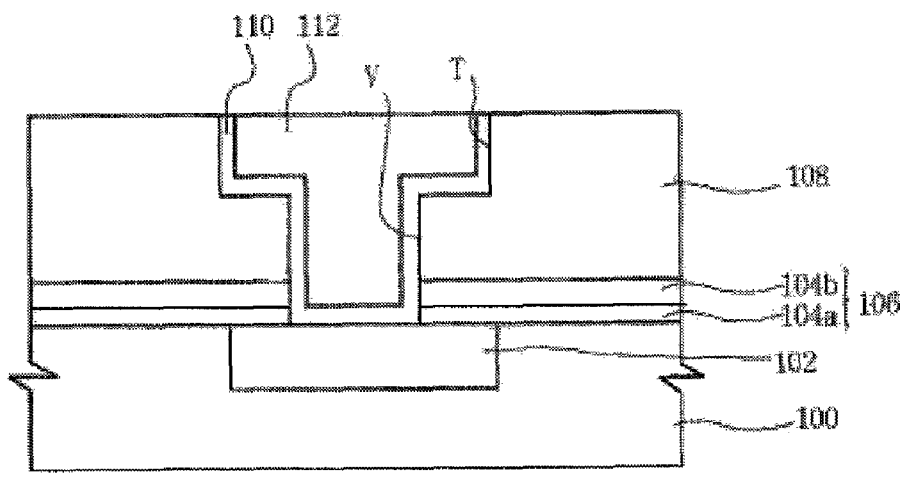
FIG. 4 is a cross-sectional view showing a copper interconnection in a semiconductor device according to embodiments.

FIG. 4 is a cross-sectional view showing a copper interconnection of a semiconductor according to different embodiments.

As shown in FIG. 4, a diffusion barrier 106 and an interlayer dielectric layer 108 are sequentially deposited over a substrate 100.

The substrate 200 includes individual elements (not shown) and a lower conductor 102. The lower conductor 102 may be an interconnection formed of copper, for example, having a relatively low resistance.

The diffusion barrier 106 includes a first diffusion barrier 104a and a second diffusion barrier 104b, which differ from each other in their characteristics. The first diffusion barrier 104a may be formed of any one of SiN, SiC or SiCN, and the second diffusion barrier 104b may be formed of SiC or SiON.

The first diffusion barrier 104a may be made of a material having a high adhesion with the lower conductor 10 since it directly abuts against the lower conductor 102. The second diffusion barrier 104b may be made of a material having a low thermal expansion coefficient with respect to the lower conductor 102 although it has a lower adhesion as compared to the first diffusion barrier 104a.

In this regard, the diffusion barrier 106 may be formed of SiN/SiC, SiCN/SiC, or SiC/SiON. The first diffusion barrier 104a may also be formed in a double layer structure, with the second diffusion barrier 104b in a single layer structure, thereby forming a diffusion barrier with a triple layer structure. For example, the diffusion barrier 106 may be formed of SiN/SiCN/SiC. The SiCN has an intermediate physical property between SiC and SiN, and may function as a buffer between them.

The interlayer dielectric layer 108 may be an organic insulator, an inorganic insulator, or the like, such as FSG (fluorine silicate glass), USG (un-doped silicate glass), or SiH4, TEOS (tetra ethyl ortho silicate) deposited in a single layer or multiple layers. The interlayer dielectric layer 108 may be formed using materials having low dielectric constant of ≦3.0 such as BD (black diamond), Silica xerogels, mesoporous silica, polyimide nanofoams, Teflon-AF, Teflon microemulsion, or the like.

The interlayer dielectric layer 108 and the diffusion barrier 106 include a via (V) formed therein for exposing the lower conductor 102 or individual elements. The interlayer dielectric layer 108 includes a trench (T) formed therein for exposing the via (V).

The via (V) and the trench (T) include a barrier metal 110 and a metal interconnection 112, to which the lower conductor 102 or individual elements are electrically connected. The thin barrier metal 110 is formed along the inner surfaces of the via (V) and the trench (T), and the metal interconnection 110 fills the via and trench defined by the inner surface of barrier metal 110.

The barrier metal 110 functions to prevent metal interconnection 112 from diffusing into other layers such as the interlayer dielectric layer 108. The barrier metal 110 also improves the adhesion between the metal interconnection 112 and the interlayer dielectric layer 108.

The barrier metal may be made of a material such as TaN, Ta, TiN, TaSiN, TiSiN, etc., and may be formed in a single layer or multiple layers. The metal interconnection 112 is made of a conductive material, for example copper, having a relatively low resistance.

Hereinafter, a method for forming a metal interconnection of such semiconductor described above will be described in detail with reference to FIGS. 5 to 7.

Figure 5:
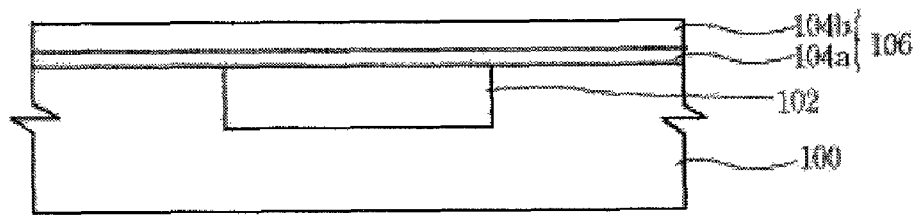
FIGS. 5 to 7 are cross-sectional views showing a method for forming a metal interconnection in a semiconductor device according to embodiments.
Figure 6:
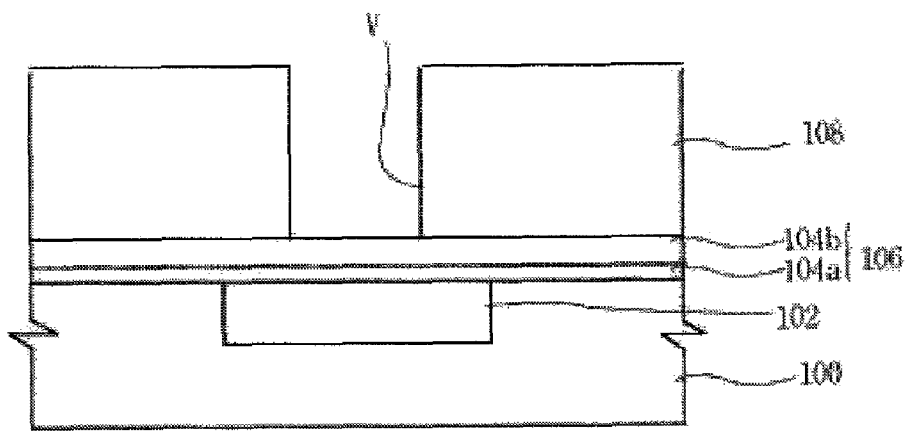
Figure 7:
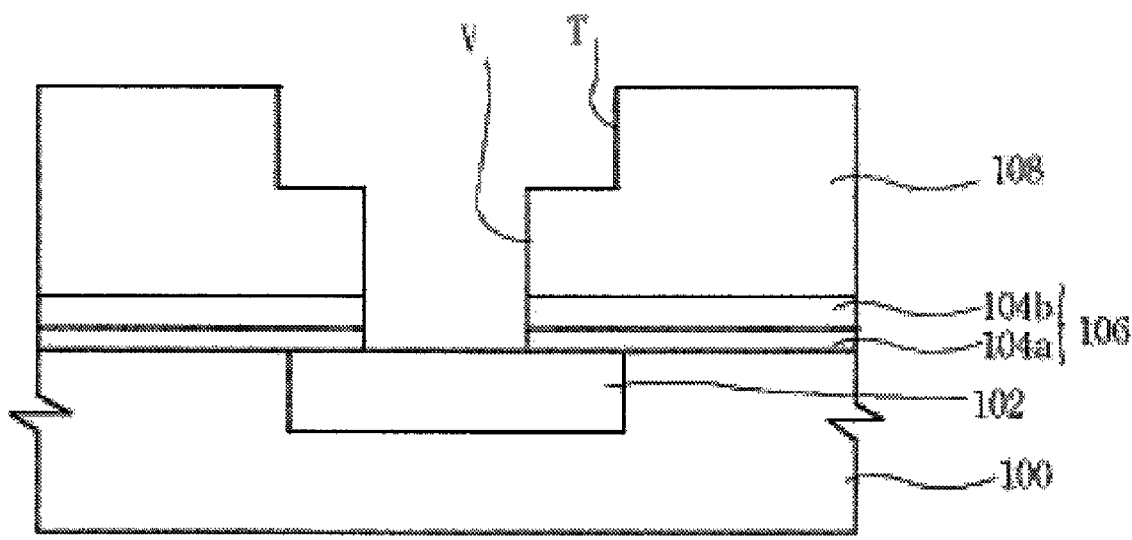

Example FIGS. 5 to 7 are cross-sectional views showing a method for forming a metal interconnection in a semiconductor device according to embodiments.

As shown in FIG. 5, a diffusion barrier 106 including the first and second diffusion barriers 104a, 104b is formed over substrate 100.

The first diffusion barrier 104a may be formed of SiN, SiC, SiCN or the like, and the second diffusion barrier 104b may be formed of SiC or SiON.

The SiN may be formed by the reaction of SiH4 gas and NH3 gas. The SiON may be formed by the reaction of SiH4 gas, CO gas and O2 gas, and the SiCN may be formed by the reaction of SiH4 gas, NH3 gas, and CH4 gas.

If the first diffusion barrier 104a is formed by SiN, it may have a thickness about 100~300 Å. If the first diffusion barrier 104a is formed by SiC, it may have a thickness about 300~700 Å. The second diffusion barrier 104b may be formed with a thickness of about 500~1,000 Å.

As shown in FIG. 6, the interlayer dielectric layer 108 is formed by depositing an insulating material over the diffusion barrier 106. The interlayer dielectric layer 108 is etched by a selective etching process, forming the via (V) exposing the diffusion barrier 106. The diffusion layer 106 may be used as an etch stop layer while forming the via (V).

As shown in FIG. 7, the trench (T) for exposing the via (V) is formed in the interlayer dielectric layer 108 using a selective etching process. If the interlayer dielectric layer 108 is formed in multiple layers, any one layer of the interlayer dielectric layer 108 may be used as an etching stop layer for forming the trench (T).

As shown in FIG. 4, a first metal layer is formed by depositing a metal over the substrate 100 including the via (V) and the trench (T). A second metal layer is formed by depositing a copper layer, filling the via and the trench.

A CMP process flattens the substrate 100, thereby finishing barrier metal 100 and metal interconnection 112.

As described above, in accordance with embodiments, a layer having excellent adhesion and a layer having a small difference in thermal expansion coefficients with other layers are formed together as a diffusion barrier. This prevents metal diffusion from the metal interconnection, and improves the reliability of an interconnection without causing a void.

The diffusion barriers having different characteristics can be easily formed without separate additional processes, but rather by changing gases forming the diffusion barrier.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A metal interconnection in a semiconductor device comprising:
   a semiconductor substrate including an electric conductor;
   first and second diffusion barriers formed over the semiconductor substrate, wherein the first diffusion barrier directly contacts the electric conductor;
   an interlayer dielectric layer formed over the second diffusion barrier and having a trench exposing a portion of the electric conductor; and
   a metal interconnection formed to fill the trench,
   wherein a difference in thermal expansion coefficients between the second diffusion barrier and the interlayer dielectric layer is smaller than a difference in thermal expansion coefficients between the first diffusion barrier and the interlayer dielectric layer.

2. The metal interconnection as claimed in claim 1, wherein the first diffusion barrier comprises any one of SiN, SiC or SiCN.

3. The metal interconnection as claimed in claim 1, wherein the second diffusion barrier comprises one of SiC or SiON.

4. The metal interconnection as claimed in claim 1, wherein the first diffusion barrier comprises two layers, the first layer comprising SiN and the second layer comprising SiCN.

5. The metal interconnection as claimed in claim 1, wherein the electric conductor and the metal interconnection comprise copper.

6. The metal interconnection as claimed in claim 4, wherein the second diffusion barrier comprises SiC.

7. A method for forming a metal interconnection of a semiconductor device comprising:
   stacking a first diffusion barrier, a second diffusion barrier and an interlayer dielectric layer over a semiconductor substrate having an electric conductor formed therein, wherein the first diffusion barrier directly contacts the electric conductor;
   forming a trench through a selective etching process to expose the a portion of the electric conductor while leaving a portion of the first diffusion barrier on and directly contacting a portion of the electric conductor; and
   forming a metal interconnection to fill the trench,
   wherein a difference in thermal expansion coefficients between the second diffusion barrier and the interlayer dielectric layer is smaller than a difference in thermal expansion coefficients between the first diffusion barrier and the interlayer dielectric layer.

8. The method as claimed in claim 7, wherein the first diffusion barrier is formed using any one of SiN, SiC or SiCN.

9. The method as claimed in claim 7, wherein the second diffusion barrier is formed using SiC or SiON.

10. The method as claimed in claim 7, wherein the first diffusion barrier is formed of two layers, the first layer comprising SiN and the second layer comprising SiCN.

11. The method as claimed in claim 10, wherein the second diffusion barrier comprises SiC.

12. A method comprising:
    forming a lower conductor in a semiconductor substrate;
    sequentially forming a first barrier layer on and directly contacting the lower conductor and a second barrier layer on and contacting the first barrier layer;
    forming a dielectric layer over the second barrier layer;
    forming a via in the dielectric layer exposing the second barrier layer by performing a first etching process;
    forming a trench in the dielectric layer by performing a second etching process;
    and then
    forming an upper conductor to fill the trench.

13. The method of claim 12, wherein a difference in thermal expansion coefficients between the second barrier layer and the dielectric layer is smaller than a difference in thermal expansion coefficients between the first barrier layer and the dielectric layer.

14. The method of claim 12, wherein during the second etching process, the second barrier layer is used as an etch stop layer.

15. The method of claim 12, wherein the dielectric layer is composed of a multilayered structure.

16. The method of claim 15, wherein during the second etching process, one layer of the multilayered structure is used as an etch stop layer.

17. The method of claim 12, wherein forming the lower conductor comprises:
    forming a first metal layer in the semiconductor substrate.

18. The method of claim 17, wherein forming the upper conductor comprises:
    forming a second metal layer as a third barrier layer on sidewalls of the trench and via and on the first metal layer; and then
    forming a second metal layer on the third barrier layer to fill the trench and the via.

* * * * *